(12) United States Patent
Tsai et al.

(10) Patent No.: US 9,418,049 B2
(45) Date of Patent: Aug. 16, 2016

(54) METHOD AND SYSTEM FOR ESTABLISHING PARAMETRIC MODEL

(71) Applicants: Taiwan Semiconductor Manufacturing Co., Ltd, Hsin-Chu (TW); National Taiwan University, Taipei (TW)

(72) Inventors: Kuen-Yu Tsai, Taipei (TW); Chun-Hung Liu, New Taipei (TW)

(73) Assignees: TAIWAN SEMICONDUCTOR MANUFACTURING CO., LTD, Hsin-Chu (TW); NATIONAL TAIWAN UNIVERSITY, Taipei (TW)

( * ) Notice: Subject to any disclaimer, the term of this patent is extended or adjusted under 35 U.S.C. 154(b) by 776 days.

(21) Appl. No.: 13/742,881

(22) Filed: Jan. 16, 2013

(65) Prior Publication Data

US 2014/0200866 A1    Jul. 17, 2014

(51) Int. Cl.
  *G03F 7/20*  (2006.01)
  *G06F 17/18*  (2006.01)
  *H01J 37/00*  (2006.01)
  *G03F 1/70*  (2012.01)

(52) U.S. Cl.
  CPC ............... *G06F 17/18* (2013.01); *G03F 7/705* (2013.01); *G03F 7/70433* (2013.01); *H01J 37/00* (2013.01); *G03F 1/70* (2013.01)

(58) Field of Classification Search
  None
  See application file for complete search history.

(56) References Cited

U.S. PATENT DOCUMENTS

| | | | | | |
|---|---|---|---|---|---|
| 5,796,983 | A * | 8/1998 | Herzinger | ............... | H01L 22/12 257/E21.53 |
| 6,052,626 | A * | 4/2000 | Inui | ......................... | G06G 7/48 355/53 |
| 6,148,099 | A * | 11/2000 | Lee | ........................ | G06T 7/0006 382/145 |
| 6,317,640 | B1 * | 11/2001 | Rao | ....................... | G06F 17/5009 700/121 |
| 7,110,912 | B1 * | 9/2006 | Tiwald | ................... | G01N 21/41 702/170 |
| 7,224,461 | B2 * | 5/2007 | Morris | ................. | G01N 21/211 356/445 |

(Continued)

FOREIGN PATENT DOCUMENTS

| TW | 200540674 | 12/2005 |
|---|---|---|
| TW | 201030483 | 8/2010 |

OTHER PUBLICATIONS

Taiwanese language office action dated Apr. 2, 2014.
(Continued)

*Primary Examiner* — Kibrom K Gebresilassie
(74) *Attorney, Agent, or Firm* — McClure, Qualey & Rodack, LLP

(57) ABSTRACT

A method for establishing a parametric model of a semiconductor process is provided. A first intermediate result is generated according to layout data and a non-parametric model of the semiconductor process. A first response is obtained according to the first intermediate result. A specific mathematical function is selected from a plurality of mathematical functions, and the parametric model is obtained according to the specific mathematical function. A second intermediate result is generated according to the layout data and the parametric model. A second response is obtained according to the second intermediate result. It is determined whether the parametric model is an optimal model according to the first and second responses.

21 Claims, 6 Drawing Sheets

(56) References Cited

U.S. PATENT DOCUMENTS

| | | | |
|---|---|---|---|
| 7,430,051 B2* | 9/2008 | Diebold | G01B 11/0641 356/369 |
| 7,626,712 B2* | 12/2009 | Price | G01B 11/0616 356/630 |
| 8,170,964 B2 | 5/2012 | Chen et al. | |
| 2003/0063815 A1* | 4/2003 | Watanabe | G02B 5/20 382/255 |
| 2004/0225383 A1* | 11/2004 | Tsai | G05B 13/0265 700/29 |
| 2006/0173559 A1* | 8/2006 | Kirshenbaum | G05B 13/048 700/31 |
| 2008/0021945 A1 | 1/2008 | Hamilton et al. | |
| 2008/0148197 A1* | 6/2008 | Bickford | G06F 17/5045 438/14 |
| 2009/0307649 A1* | 12/2009 | Pramanik | G03F 1/144 716/50 |
| 2011/0027919 A1* | 2/2011 | Wack | G01B 11/16 438/16 |
| 2012/0212722 A1* | 8/2012 | Smith | G03F 7/7055 355/67 |
| 2012/0323356 A1* | 12/2012 | Dziura | G01N 21/47 700/121 |
| 2012/0330554 A1* | 12/2012 | Ross | G01V 1/303 702/17 |
| 2013/0024823 A1* | 1/2013 | Tsai | H01J 37/3174 716/52 |
| 2013/0073070 A1* | 3/2013 | Tsai | G01N 21/956 700/103 |
| 2013/0173332 A1* | 7/2013 | Ho | G06Q 10/06 707/7.27 |
| 2013/0242283 A1* | 9/2013 | Bailey | G01S 17/89 356/4.01 |
| 2014/0278165 A1* | 9/2014 | Wenzel | G06Q 50/08 702/61 |

OTHER PUBLICATIONS

English language translation of abstract of TW 200540674 (published Dec. 16, 2005).

English language translation of abstract of TW 201030483 (published Aug. 16, 2010).

Liu, C.H., et al.; "New Parametric Point Spread Function Calibration Methodology for Improving the Accuracy of Patterning Prediction in Electron-Beam Lithography;" Journal of Micro/Nanolithography, MEMS, and MOEMS; Jan.-Mar. 2012; pp. 013009-1-013009-12.

* cited by examiner

| Number of terms | Denotation of PSF form | Calculation priority |
|---|---|---|
| 1 | 1G | 1 |
| | 1E | 2 |
| 2 | 2G | 3 |
| | 2E | 4 |
| | 1G+1E | 5 |
| 3 | 3G | 6 |
| | 3E | 7 |
| | 2G+1E | 8 |
| | 1G+2E | 9 |

FIG. 7

METHOD AND SYSTEM FOR ESTABLISHING PARAMETRIC MODEL

CROSS REFERENCE TO RELATED APPLICATIONS

This application claims the benefit of Journal of Micro/Nanolithography, MEMS, and MOEMS "New parametric point spread function calibration methodology for improving the accuracy of patterning prediction in electron-beam lithography" filed March, 2012, the entirety of which is incorporated by reference herein.

BACKGROUND OF THE INVENTION

1. Field of the Invention

The invention relates to a method for establishing a parametric model, and more particularly, to a method for establishing a parametric model of a semiconductor process.

2. Description of the Related Art

Lithography technology is important in semiconductor processes. Lithography technology must conform to the specifications of the new generation of circuit designs, or the semiconductor industry will be faced with a dilemma. In recent years, integrated circuit (IC) design specification has shrunk in size each year. Therefore, Lithography technology related to pattern definition effectiveness must meet the demands for the development of the exposure device, the establishment of the process, mask making and other related technologies, and the investments in manpower, material resources, financial resources and time are also important factors.

In the traditional lithography system, optical lithography equipment is standard. However, for a deep ultraviolet (DUV) light, a resolution of the DUV light is related to a wavelength of the light, thereby having limits. Therefore, lithography technology is gradually developing toward the electron beam, X-ray, extreme ultraviolet (EUV), ion beam and particle beam.

In a particle beam lithography process, a particle beam will pass through a resist layer and is internally scattered within the resist layer. An energy distribution from the particle beam, when applied to the resist layer, will affect the development of the resist layer, thereby affecting the critical dimensions of IC design. Therefore, how to accurately predict the energy distribution is a critical technology.

BRIEF SUMMARY OF THE INVENTION

Methods and system for establishing parametric model of a semiconductor process are provided. An embodiment of a method for establishing a parametric model of a semiconductor process is provided. A first intermediate result is generated according to layout data and a non-parametric model of the semiconductor process. A first response is obtained according to the first intermediate result. A specific mathematical function is selected from a plurality of mathematical functions, and the parametric model is obtained according to the specific mathematical function. A second intermediate result is generated according to the layout data and the parametric model. A second response is obtained according to the second intermediate result. It is determined whether the parametric model is an optimal model according to the first and second responses.

Moreover, another embodiment of a method for establishing parametric model of a semiconductor process is provided. A target curve is obtained according to layout data and a non-parametric model of the semiconductor process. A specific mathematical function is selected from a database comprising a plurality of mathematical functions according to a specific condition. At least one coefficient of the specific mathematical function is determined according to the target curve and the layout data, so as to obtain a prediction curve. It is determined whether a comparison result between the target curve and the prediction curve conforms to a predetermined condition. It is determined that the prediction curve is an optimal curve and the specific mathematical function is an optimal model when the comparison result conforms to the predetermined condition.

Furthermore, an embodiment of a system for establishing a parametric model of a semiconductor process is provided. The system comprises: a first processing module, generating a first intermediate result according to layout data and a non-parametric model of the semiconductor process, and obtaining a first response according to the first intermediate result; a second processing module, obtaining a first parametric model according to one of a plurality of mathematical functions, generating a second intermediate result according to the first parametric model and the layout data, and obtaining a second response according to the second intermediate result; and a determining unit, determining whether the first parametric model is an optimal model according to the first response and the second response.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 7 shows a table illustrating an exemplary ranked sequence of PSF forms and calculation priorities.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
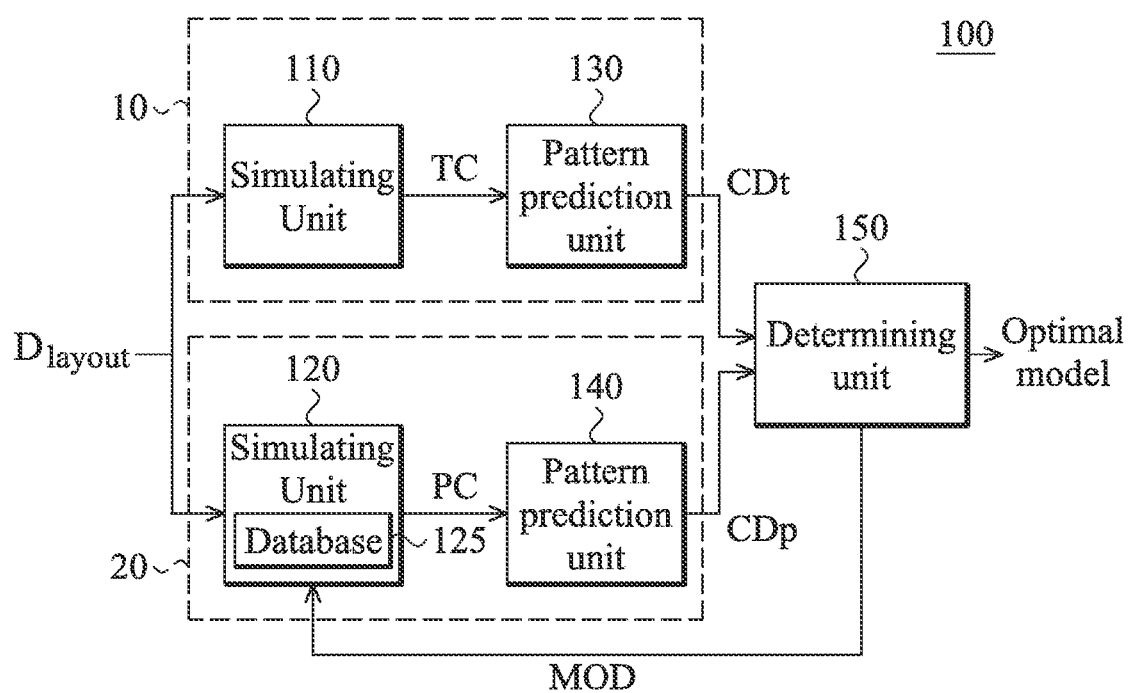
FIG. 1 shows a system for establishing a parametric model of a semiconductor process according to an embodiment of the invention.

FIG. 1 shows a system 100 for establishing a parametric model of a semiconductor process according to an embodiment of the invention. The system 100 comprises a processing module 10, a processing module 20 and a determining unit 150, wherein the processing module 10 comprises a simulating unit 110 and a pattern prediction unit 130, and the processing module 20 comprises a simulating unit 120 and a pattern prediction unit 140. The simulating unit 110 obtains an intermediate result TC according to layout data $D_{layout}$ and a non-parametric model of the semiconductor process, wherein the non-parametric model is obtained according to the experiments and simulation results of the semiconductor process. In the embodiment, the intermediate result TC is used to represent an energy intensity distribution scattered within a resist layer by predicting a particle beam passing through the resist layer according to the non-parametric mode. Furthermore, the pattern prediction unit 130 obtains a response CDt corresponding to the non-parametric model according to the intermediate result TC. In the embodiment, the response CDt represents a critical dimension (CD) of the semiconductor process, that is obtained according to the non-parametric model. Moreover, the simulating unit 120 obtains an intermediate result PC according to the layout data $D_{layout}$ and a parametric model. The simulating unit 120 selects a mathematical function from a plurality of mathematical functions according to a specific rule and obtains the parametric model according to the selected mathematical function, wherein detail of the specific rule will be described as follows. In the embodiment, the intermediate result PC is used to represent an energy intensity distribution scattered within a resist layer by predicting a particle beam passing through the resist layer according to the parametric mode. Next, the pattern prediction unit 140 obtains a response CDp corresponding to the parametric model according to the intermediate result PC. In the embodiment, the response CDp represents a critical dimension of the semiconductor process that is obtained according to the parametric model. In the embodiment, the pattern prediction unit 130 and the pattern prediction unit 140 can be integrated in the same pattern predictor.

In FIG. 1, the determining unit 150 determines whether the parametric model obtained by the simulating unit 120 is an optimal model of the semiconductor process according to the response CDp and the response CDt. If the parametric model is the optimal model, the determining unit 150 outputs the parametric model, so as to perform the subsequent processes by a back end system according to the parametric model. If the parametric model is not the optimal model, the determining unit 150 generates an adjustment signal MOD to the simulating unit 120, so as to notify the simulating unit 120, to re-select another mathematical function from the mathematical functions until the determining unit 150 determines that the current obtained parametric model is the optimal model of the semiconductor process, and then the parametric model, the intermediate result PC and the response CDp corresponding to the current obtained parametric model are obtained. In one embodiment, the determining unit 150 determines whether the parametric model currently obtained by the simulating unit 120 is the optimal model of the semiconductor process according to a comparison result between the response CDp and the response CDt (e.g. deviation). For example, when a deviation between the response CDp and the response CDt conforms to a predetermined condition, the determining unit 150 determines that the parametric model currently obtained by the simulating unit 120 is the optimal model of the semiconductor process.

In FIG. 1, the simulating units and the pattern prediction units of the processing module 10 and the processing module 20 can be modified according to actual applications. For example, in each processing module, various simulating units can be used to obtain the intermediate results. In addition, the pattern prediction unit of each processing module can obtain the response according to the characteristics of various processing technologies (e.g. photolithography, development, etching and so on).

Figure 2:
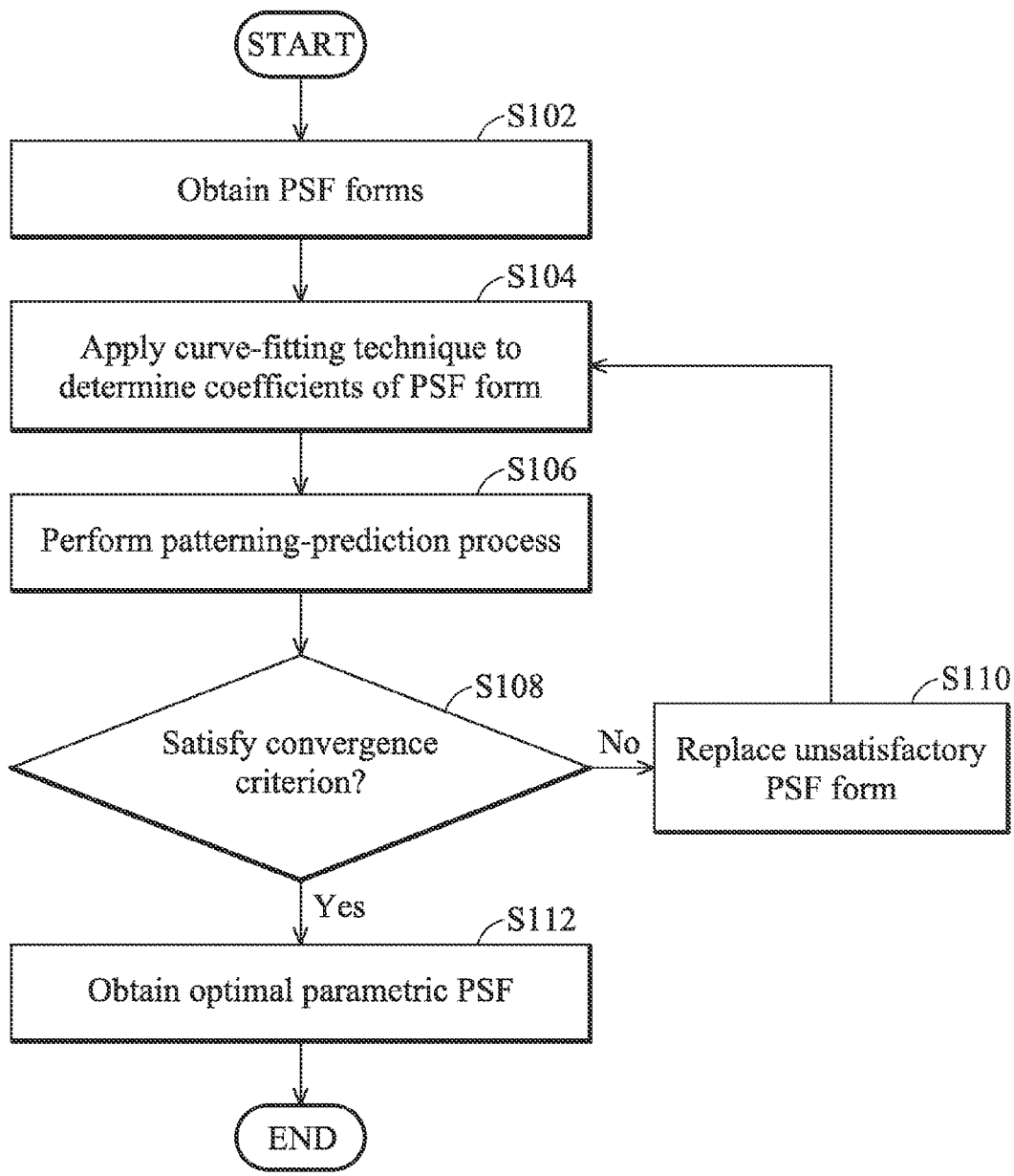
FIG. 2 shows a method for establishing a parametric model of a semiconductor process according to an embodiment of the invention.

FIG. 2 shows a method for establishing a parametric model of a semiconductor process according to an embodiment of the invention. First, in step S102, a plurality of basic functions that are used to represent point spread function (PSF) forms are obtained, and the basic functions are ranked under a default number of terms. Every continuous function in the function space can be the basis function, such as the Gaussian function, exponential function, Zernike polynomials, hyperbolic function, and any other function. The PSF form that contains the smallest number of terms and the lowest complexity is adopted with the top priority for the subsequent step. Next, in step S104, the coefficients of the PSF form is determined by applying a curve-fitting technique to fit a set of absorbed energy distribution (AED) data points and to determine optimal coefficients of the PSF form by minimizing a chosen merit function (MF). Next, the PSF form with determined coefficients is utilized in a patterning-prediction process (step S106) to verify whether the PSF form satisfies convergence criterion (step S108). If no, the current PSF form is replaced with another PSF form that has been ranked in step S102 (step S110), and the coefficients of the next PSF form will be determined. Specifically, if the patterning-prediction results simulated using the ranked PSF forms, under the default number of terms, cannot satisfy the convergence criterion, a new basis function is used to represent the PSF form. If the PSF form satisfies the convergence criterion, the optimal parametric PSF is obtained (step S112).

Figure 3:
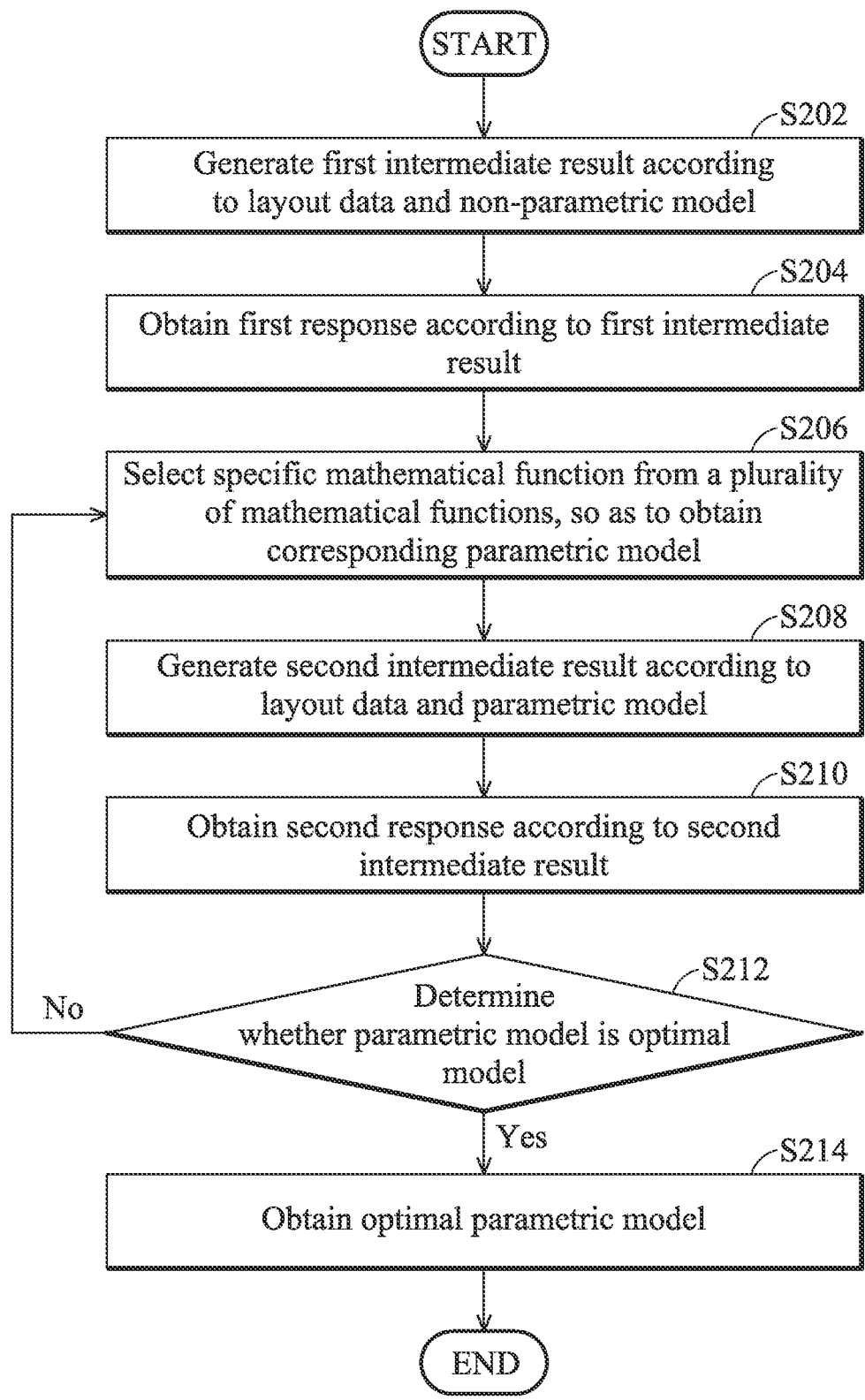
FIG. 3 shows a method for establishing a parametric model of a semiconductor process according to another embodiment of the invention.

FIG. 3 shows a method for establishing a parametric model of a semiconductor process according to another embodiment of the invention. First, in step S202, a first intermediate result (e.g. TC of FIG. 1) is generated according to layout data $D_{layout}$ and a non-parametric model of the semiconductor process. Next, in step S204, a first response (e.g. CDt of FIG. 1) is obtained according to the first intermediate result. Next, in step S206, a specific mathematical function is selected from a plurality of mathematical functions, and a parametric model is obtained according to the specific mathematical function. Next, in step S208, a second intermediate result (e.g. PC of FIG. 1) is generated according to the layout data $D_{layout}$ and the parametric model. Next, in step S210, a second response (e.g. CDp of FIG. 1) is obtained according to the second intermediate result. Next, in step S212, it is determined whether the parametric model is an optimal model of the semiconductor process according to the first response and the second response. If yes, the optimal model of the semiconductor process is obtained (step S214). If no, the procedure is backed to step S206, and another specific mathematical function is selected from the mathematical functions, and then a parametric model corresponding to another specific mathematical function is obtained for subsequent procedures.

Figure 4:
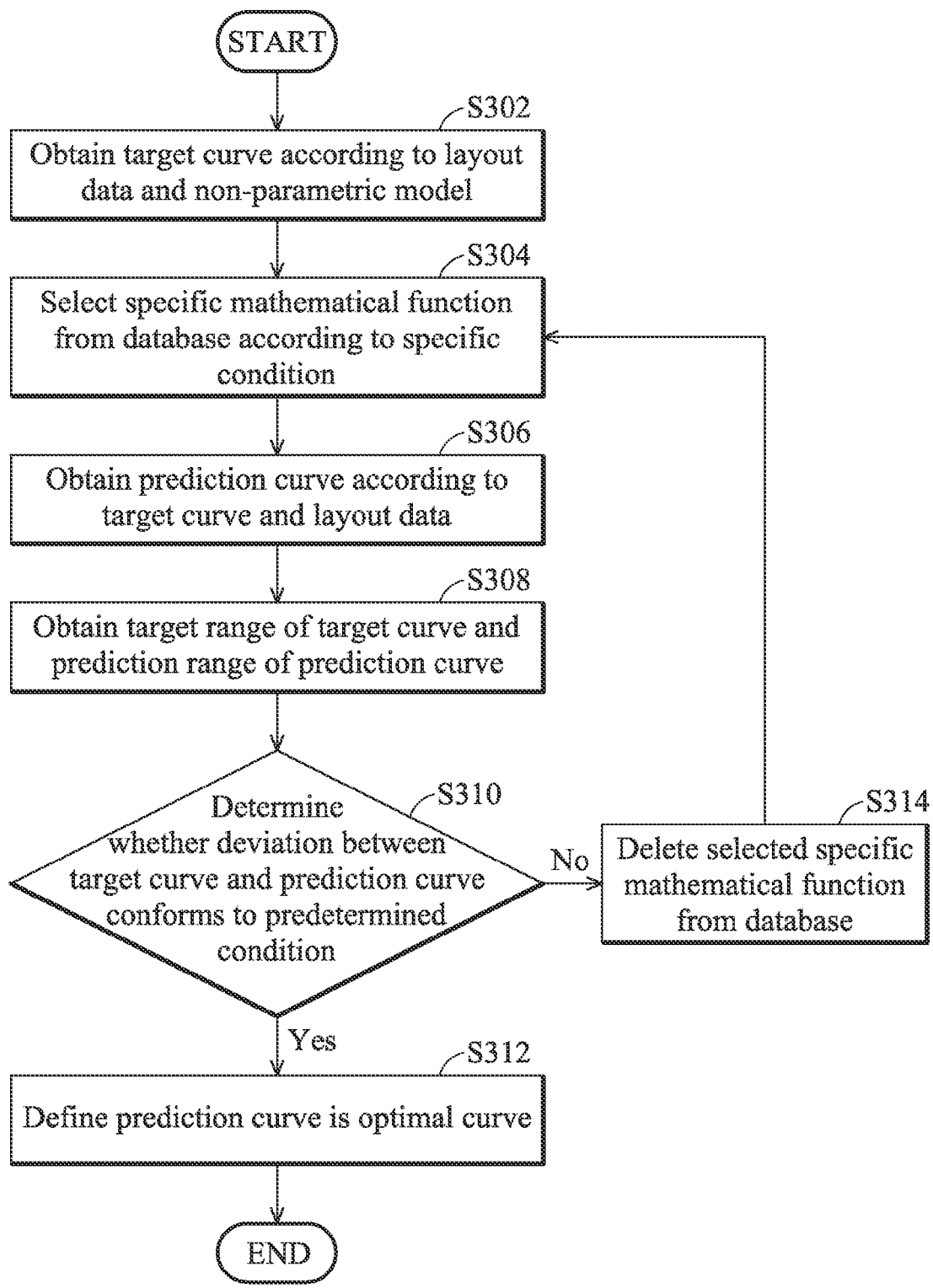
FIG. 4 shows a method for establishing a parametric model of a semiconductor process according to another embodiment of the invention.
Figure 5:
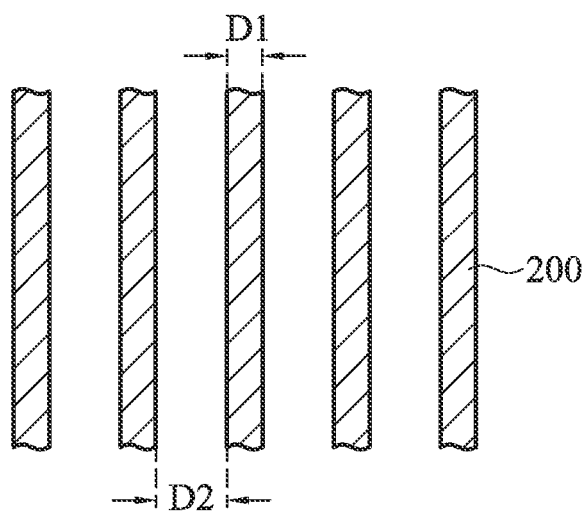
FIG. 5 shows a schematic illustrating a width and a space of each wire in a semiconductor process.

FIG. 4 shows a method for establishing a parametric model of a semiconductor process according to another embodiment of the invention. FIG. 5 shows a schematic illustrating a width D1 and a space D2 of each wire 200 in a semiconductor process. The width D1 and the space D2 will be respectively standardized to 22 nm and 20 nm according to a target of International Technology Roadmap for Semiconductors (ITRS) in 2015. It is to be noted that the method of FIG. 4 and the system 100 of FIG. 1 are collocated as an example to illustrate, and does not limit the invention.

Figure 6:
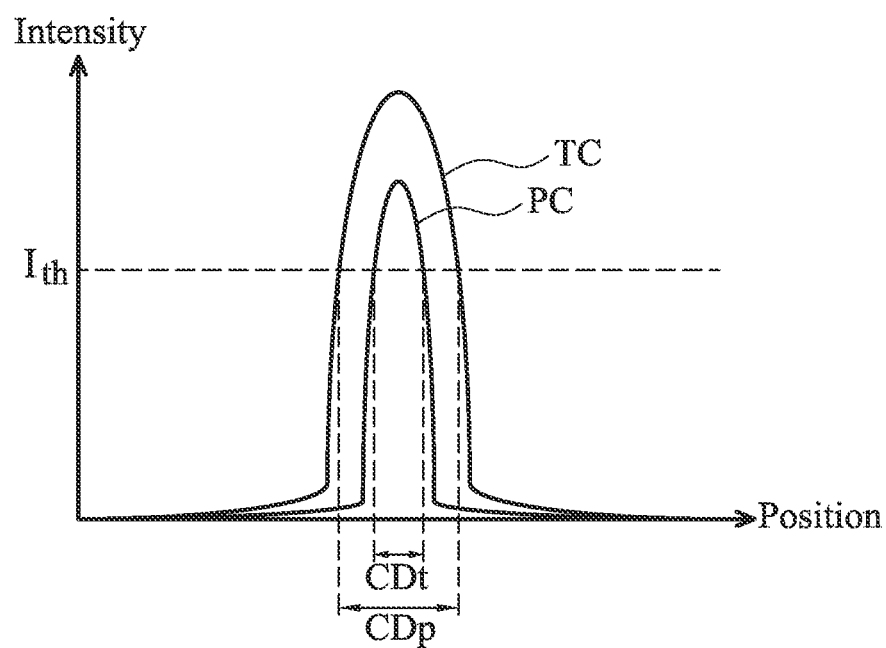
FIG. 6 shows a schematic illustrating a target curve and a prediction curve according to an embodiment of the invention.

Referring to FIG. 1 and FIG. 4 together, first, in step S302, the simulating unit 110 obtains a target curve TC (e.g. TC of FIG. 1) according to layout data $D_{layout}$ and a non-parametric model of the semiconductor process, as shown in FIG. 6. In one embodiment, the simulating unit 110 comprises a Monte Carlo (MC) simulator, and the MC simulator obtains the target curve TC according to a predetermined number of electron trajectories, an electron beam size, a material of a resist layer, a thickness of a resist layer and a material of a substrate. In another embodiment, the simulating unit 110 obtains the target curve TC according to actual experiment results.

Next, in step S304, the simulating unit 120 selects a specific mathematical function from a database 125 according to a specific condition, wherein the specific mathematical function is a parametric point spread function (parametric PSF) with a plurality of coefficients. In the embodiment, the database 125 comprises a plurality of basis functions, such as at least one Gaussian function, at least one exponential function, at least one polynomial function, at least one hyperbolic function, at least one Zernike function or combinations thereof. For example, the specific mathematical function may be "a double-Gaussian function form (denoted by 2G)", "a triple-Gaussian function form (denoted by 3G)", "a double-Gaussian-plus-single-exponential function form (denoted by 2G+1E)" or "a single-Gaussian-plus-double-exponential function form (denoted by 1G+2E)". In the database 125, each function form has a different number of terms and complexity. Therefore, according to the specific rule, the simulating unit 120 ranks the function forms of the database 125 according to the amount of the number of terms and the magnitude of the complexities of the function forms, i.e. the number of terms are ranked from a few to many and the complexities are ranked from low to high when the number of terms are the same. FIG. 7 shows a table illustrating an exemplary ranked sequence of PSF forms and calculation priorities. In FIG. 7, the complexity of a 2G function form is lower than that of a 3G function form, and the complexity of a Gaussian function form (denoted by G)" is lower than that of a exponential function form (denoted by E) when the number of terms are the same. Therefore, when the number of terms are the same, the complexity of a 3G function form is lower than that of a 2G+1E function form, and the complexity of a 2G+1E function form is lower than that of 1G+2E function form. Furthermore, as shown in the following, the Equation (1) shows a 2G function form, the Equation (2) shows a 3G function form, the Equation (3) shows a 2G+1E function form and the Equation (4) shows a 1G+2E function form.

$$f(r) = \frac{1}{\pi(1+\eta)} \left\{ \frac{1}{\alpha^2} \exp\left(-\frac{r^2}{\alpha^2}\right) + \frac{\eta}{\beta^2} \exp\left(-\frac{r^2}{\beta^2}\right) \right\} \quad (1)$$

$$f(r) = \frac{1}{\pi(1+\eta+\eta')} \left\{ \frac{1}{\alpha^2} \exp\left(-\frac{r^2}{\alpha^2}\right) + \frac{\eta}{\beta^2} \exp\left(-\frac{r^2}{\beta^2}\right) + \frac{\eta'}{\gamma^2} \exp\left(-\frac{r^2}{\gamma^2}\right) \right\} \quad (2)$$

$$f(r) = \frac{1}{\pi(1+\eta+\eta')} \left\{ \frac{1}{\alpha^2} \exp\left(-\frac{r^2}{\alpha^2}\right) + \frac{\eta}{\beta^2} \exp\left(-\frac{r^2}{\beta^2}\right) + \frac{\eta'}{2\gamma^2} \exp\left(-\frac{r^2}{\gamma^2}\right) \right\} \quad (3)$$

$$f(r) = \frac{1}{\pi(1+\eta+\eta')} \left\{ \frac{1}{2\alpha^2} \exp\left(-\frac{r}{\alpha}\right) + \frac{\eta}{\beta^2} \exp\left(-\frac{r^2}{\beta^2}\right) + \frac{\eta'}{2\gamma^2} \exp\left(-\frac{r}{\gamma}\right) \right\}, \quad (4)$$

where the coefficient α represents a forward scattering range, the coefficient β represents a backward scattering range, and the coefficient η represent an intensity ratio of the forward scattering electrons and the backward scattering electrons. The coefficient γ represents a location, and f(r) represents energy intensity. In Equation (2) and Equation (3), the first term $$\frac{1}{\alpha^2} \exp\left(-\frac{r^2}{\alpha^2}\right)$$

is identical to a meaning of the first term of the Equation (1). In the equations (2), (3) and (4), the second term $$\frac{1}{\beta^2} \exp\left(-\frac{r^2}{\beta^2}\right)$$

is identical to a meaning of the second term of the Equation (1). The third terms $$\frac{\eta'}{\gamma^2} \exp\left(-\frac{r^2}{\gamma^2}\right)$$

and $$\frac{\eta'}{2\gamma^2} \exp\left(-\frac{r}{\gamma}\right)$$

with the coefficient γ represent a further scattering phenomenon, which can not be described in the first and second terms. The coefficient η' represents a ratio of the third term and the first term. In the embodiment, the simulating unit 120 selects a mathematical function with a smallest number of terms and a lowest complexity from the database 125, as a specific mathematical function that is to be calculated first. For example, the Equation (1) with a smallest number of terms and a lowest complexity is selected from the Equations (1)-(3) as the specific mathematical function.

Next, in step S306, the simulating unit 120 determines the coefficients of the specific mathematical function according to the target curve TC and the layout data $D_{layout}$, and obtains a prediction curve PC (i.e. PC of FIG. 1), as shown in FIG. 6. For example, a curve fitting is performed for the target curve TC, to obtain the coefficients of the specific mathematical function. In the embodiment, the simulating unit 120 sets the initial value of the coefficient α at 4.3 nm, an initial value of the coefficient β at 224.2 nm, and an initial value of the coefficient η at 0.7. The simulating unit 120 uses a standard non-linear least-squares curve to calculate each coefficient, i.e. Nelder-mead simplex algorithm, so as to obtain the coefficients that can minimize the following equation.

$$\sum_{i=1}^{N} \left( \frac{\log(E_i) - \log(F_i)}{\log(E_i)} \right)^2, \quad (5)$$

where i represents various positions of the curve, $E_i$ represents a value of the position i of the target curve TC, and $F_i$ represents a value of the position i of the prediction curve PC.

Referring to the following Table 1, in the embodiment, the simulating unit 120 obtains that the coefficient α of the Equation (1) is 6.0 nm, the coefficient β is 173.7 nm, and the coefficient η is 0.7763.

TABLE 1

| Prediction curve | α (nm) | β (nm) | γ | η | η' | Deviation (nm) |
|---|---|---|---|---|---|---|
| Equation (1) (2G) | 6.0 | 173.7 | — | 0.7763 | — | 3.00 |

Next, in step S308, the pattern prediction units 130 and 140 obtain a target range of the target curve TC (i.e. CDt of FIG. 1) and a prediction range of the prediction curve PC (i.e. CDp of FIG. 1), respectively, as shown in FIG. 6, wherein the simulating unit 120 obtains the prediction curve PC of FIG. 6 by substituting 6.0 nm, 173.7 nm and 0.7763 for the coefficients α, β and η of the Equation (1). In FIG. 6, the target range CDt and the prediction range CDp represent the ranges of the target curve TC and the prediction curve PC that equal a reference value $I_{th}$, respectively.

Referring back to FIG. 1 and FIG. 4, next, in step S310, the determining unit 150 obtains a deviation between the target curve TC and the prediction curve PC according to the target range CDt and the prediction range CDp, and further determines whether the deviation conforms to a predetermined condition. When the deviation of the prediction curve PC and the target curve TC conforms to the predetermined condition, the determining unit 150 defines that the prediction curve PC is an optimal curve, and defines that the specific mathematical function is an optimal model of the semiconductor process (step S312). If the deviation of the prediction curve PC and the target curve TC does not conform to the predetermine condition, the selected specific mathematical function is deleted from the database 125 (step S314), and step 304 to step 310 are performed continuously until the optimal curve is obtained (step S312).

For example, the determining unit 150 determines whether a deviation between the prediction range CDp and the target range CDt is smaller than a toleration value. Assuming that the toleration value is 0.5 nm, if the deviation is smaller than the toleration value, the determining unit 150 determines that the comparison result between the prediction curve PC and the target curve TC conforms to the predetermined condition. Otherwise, the determining unit 150 will determine that the comparison result between the prediction curve PC and the target curve TC does not conform to the predetermined condition. Taking FIG. 6 as an example and referring to Table 1 above, a deviation between the prediction range CDp and the target range CDt of Equation (1) is 3.00 nm, which is larger than the toleration value (e.g. 0.5 nm). Therefore, the comparison result between the prediction curve PC and the target curve TC does not conform to the predetermined condition. Thus, the simulating unit 120 deletes the function form of Equation (1) (i.e. double-Gaussian function form) from the database 125. Next, the step S304 is performed, and then the simulating unit 120 re-selects Equation (2) with a smallest number of terms and a lowest complexity from the database 125, i.e. triple-Gaussian function form.

Referring to the following Table 2, in step S306, the simulating unit 120 obtains that the coefficient α is 2.3 nm, the coefficient β is 174.5 nm, the coefficient γ is 13.8 nm, the coefficient η is 0.9270 and the coefficient η' is 0.2348 in Equation (2).

TABLE 2

| Prediction curve | α (nm) | β (nm) | γ | η | η' | Deviation (nm) |
|---|---|---|---|---|---|---|
| Equation (2) (3G) | 2.3 | 174.5 | 13.8 | 0.9270 | 0.2348 | 1.50 |

Next, from step S308 to step S310, referring to Table 2 above, a deviation between the prediction range CDp and the target range CDt of Equation (2) is 1.50 nm, which is larger than the toleration value (e.g. 0.5 nm). Therefore, a comparison result between the prediction curve PC and the target curve TC does not conform to the predetermined condition.

According to the prediction curve PC of the selected Equation (2), step S314 is performed, and the function form of Equation (2) (i.e. triple-Gaussian function form) is deleted from the database 125. Next, in step S304, the simulating unit 120 re-selects Equation (3) with a smallest number of terms and a lowest complexity from the database 125, i.e. double-Gaussian-plus-single-exponential function form.

Referring to the following Table 3, in step S306, the simulating unit 120 obtains that the coefficient α is 1.5 nm, the coefficient β is 174.5 nm, the coefficient γ is 4.7 nm, the coefficient η is 1.1035 and the coefficient η' is 0.4739 in Equation (3).

TABLE 3

| Prediction curve | α (nm) | β (nm) | γ | η | η' | Deviation (nm) |
|---|---|---|---|---|---|---|
| Equation (3) (2G + 1E) | 1.5 | 174.5 | 4.7 | 1.1035 | 0.4739 | 1.25 |

Next, from step S308 to step S310, referring to Table 3 above, a deviation between the prediction range CDp and the target range CDt of Equation (3) is 1.25 nm, which is larger than the toleration value (e.g. 0.5 nm). Therefore, a comparison result between the prediction curve PC and the target curve TC does not conform to the predetermined condition.

According to the prediction curve PC of the selected Equation (3), step S314 is performed, and the function form of Equation (3) (i.e. double-Gaussian-plus-single-exponential function form) is deleted from the database 125. Next, in step S304, the simulating unit 120 re-selects Equation (4) from the current function forms of the database 125, wherein Equation (4) has a number of terms equal to Equation (2) and Equation (3) and a complexity higher than Equation (2) and Equation (3).

Referring to the following Table 4, in step S306, the simulating unit 120 obtains that the coefficient α is 1.1 nm, the coefficient β is 174.8 nm, the coefficient γ is 6.8 nm, the coefficient η is 0.8991 and the coefficient η' is 0.2161 in Equation (4).

TABLE 4

| Prediction curve | α (nm) | β (nm) | γ | η | η' | Deviation (nm) |
|---|---|---|---|---|---|---|
| Equation (4) (2E + 1G) | 1.1 | 174.8 | 6.8 | 0.8991 | 0.2161 | 0.50 |

Next, in step S308, referring to Table 4 above, a deviation between the prediction range CDp and the target range CDt of Equation (4) is 0.50 nm, which is smaller than or equal to the toleration value (e.g. 0.5 nm). Therefore, a comparison result between the prediction curve PC and the target curve TC conforms to the predetermined condition, and the prediction curve PC is defined as an optimal curve in step S312.

In the embodiments, the parametric model establishing method will select a function form and determine whether a comparison result between a prediction curve and a target curve of the function form conforms to a predetermined condition, and not calculate the whole range of prediction curves to further determine the optimal function form, thereby speeding calculation effectively.

Further, in the embodiments, the parametric model establishing method will rank the number of terms and the complexity of entire function forms and then select the function form with a smallest number of terms and lowest complexity, thereby also speeding calculation effectively.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for establishing a parametric model of a semiconductor process, comprising:
    generating a first intermediate result according to layout data and a non-parametric model of the semiconductor process;
    obtaining a first response according to the first intermediate result;
    selecting a specific mathematical function from a plurality of mathematical functions, and obtaining the parametric model according to the specific mathematical function;
    generating a second intermediate result according to the layout data and the parametric model; obtaining a second response according to the second intermediate result; and
    determining whether the parametric model is an optimal model according to the first and second responses;
    fabricating a semiconductor wafer according to the layout data and the optimal model of the semiconductor process,
    wherein the first intermediate result represents a first energy intensity distribution scattered within a resist layer by predicting a particle beam passing through the resist layer according to a non-parametric mode, and the second intermediate result represents a second energy intensity distribution scattered within the resist layer by predicting the particle beam passing through the resist layer according to a parametric mode.

2. The method as claimed in claim 1, wherein the step of determining whether the parametric model is the optimal model further comprises:
    obtaining a comparison result between the first response and the second response;
    determining that the parametric model is the optimal model when the comparison result conforms to a predetermined condition; and
    re-selecting the specific mathematical function from the mathematical functions and obtaining the parametric model and the second response corresponding to the re-selected specific mathematical function, so as to determine whether the parametric model corresponding to the re-selected specific mathematical function is the optimal model according to the first response and the second response corresponding to the re-selected specific mathematical function.

3. The method as claimed in claim 1, wherein the mathematical functions comprises at least one Gaussian function, at least one exponential function, at least one polynomial function, at least one hyperbolic function, at least one Zernike function or combinations thereof.

4. The method as claimed in claim 1, wherein the specific mathematical function is a parametric point spread function with a plurality of coefficients.

5. The method as claimed in claim 1, wherein the step of selecting the specific mathematical function from the mathematical functions further comprising:
    selecting a mathematical function with a smallest number of terms and a lowest complexity from the mathematical functions as the specific mathematical function.

6. A method for establishing parametric model of a semiconductor process, comprising:
    (a) obtaining a target curve according to layout data and a non-parametric model of the semiconductor process;
    (b) selecting a specific mathematical function from a database comprising a plurality of mathematical functions according to a specific condition;
    (c) determining at least one coefficient of the specific mathematical function according to the target curve and the layout data, so as to obtain a prediction curve;
    (d) determining whether a comparison result between the target curve and the prediction curve conforms to a predetermined condition; and
    (e) determining that the prediction curve is an optimal curve and the specific mathematical function is an optimal model when the comparison result conforms to the predetermined condition;
    fabricating a semiconductor wafer according to the layout data and the optimal model of the semiconductor process,
    wherein the target curve represents a first energy intensity distribution scattered within a resist layer by predicting a particle beam passing through the resist layer according to a non-parametric mode, and the prediction curve represents a second energy intensity distribution scattered within the resist layer by predicting the particle beam passing through the resist layer according to a parametric mode.

7. The method as claimed in claim 6, further comprising:
    (f) deleting the specific mathematical function from the database when the comparison result does not conform to the predetermined condition, and re-selecting the specific mathematical function from the database according to the specific condition.

8. The method as claimed in claim 6, wherein the database comprises at least one Gaussian function, at least one exponential function, at least one polynomial function, at least one hyperbolic function, at least one Zernike function or combinations thereof.

9. The method as claimed in claim 6, wherein the specific mathematical function is a parametric point spread function with a plurality of coefficients.

10. The method as claimed in claim 6, wherein the step (d) further comprises:
    obtaining a prediction range of the prediction curve according to a reference value;
    obtaining a target range of the target curve according to the reference value; and
    obtaining the comparison result according to the prediction range and the target range.

11. The method as claimed in claim 10, wherein the step (d) further comprises:
  determining whether the comparison result is smaller than a toleration value; determining that the comparison result conforms to the predetermined condition when the comparison result is smaller than or equal to the toleration value; and
  determining that the comparison result does not conform to the predetermined condition when the comparison result is larger than the toleration value.

12. The method as claimed in claim 6, wherein the step (b) further comprises:
  selecting a mathematical function with a smallest number of terms and a lowest complexity from the database as the specific mathematical function.

13. The method as claimed in claim 10, wherein the target range and the prediction range correspond to a critical dimension of the semiconductor process.

14. A system for establishing a parametric model of a semiconductor process, comprising:
  a processor, providing an optimal model, and comprising:
  a first processing module, generating a first intermediate result according to layout data and a non-parametric model of the semiconductor process, and obtaining a first response according to the first intermediate result;
  a second processing module, obtaining a first parametric model according to one of a plurality of mathematical functions, generating a second intermediate result according to the first parametric model and the layout data, and obtaining a second response according to the second intermediate result; and
  a determining unit, determining whether the first parametric model is the optimal model according to the first response and the second response,
  wherein the first intermediate result represents a first energy intensity distribution scattered within a resist layer by predicting a particle beam passing through the resist layer according to a non-parametric mode, and the second intermediate result represents a second energy intensity distribution scattered within the resist layer by predicting the particle beam passing through the resist layer according to a parametric mode,
  wherein a back end system obtains the optimal model of the semiconductor process from the device, and fabricates a semiconductor wafer according to the layout data and the optimal model of the semiconductor process.

15. The system as claimed in claim 14, wherein when a comparison result between the first response and the second response conforms to a predetermined condition, the determining unit determines that the first parametric model is the optimal model.

16. The system as claimed in claim 15, wherein when the comparison result does not conform to the predetermined condition, the second processing module obtains a second parametric model according to another of the mathematical functions, and the determining unit determines whether the second parametric model is the optimal model according to the first response and a third response corresponding to the second parametric model.

17. The system as claimed in claim 14, wherein the first processing module comprises: a first simulating unit, generating the first intermediate result according to the layout data and the non-parametric model; and a first pattern prediction unit, obtaining the first response corresponding to the first intermediate result, wherein the second processing module comprises: a second simulating unit, generating the second intermediate result according to the first parametric model and the layout data; and a second pattern prediction unit, obtaining the second response corresponding to the second intermediate result.

18. The system as claimed in claim 14, wherein the mathematical functions comprises at least one Gaussian function, at least one exponential function, at least one polynomial function, at least one hyperbolic function, at least one Zernike function or combinations thereof.

19. The system as claimed in claim 14, wherein the specific mathematical function is a parametric point spread function with a plurality of coefficients.

20. The system as claimed in claim 14, wherein the one of the mathematical functions is a mathematical function with a smallest number of terms and a lowest complexity among the mathematical functions.

21. The system as claimed in claim 14, wherein the first response and the second response correspond to a critical dimension of the semiconductor process.

* * * * *